(12) United States Patent
Haruna et al.

(10) Patent No.: US 12,526,924 B2
(45) Date of Patent: Jan. 13, 2026

(54) CONDUCTIVE ADHESIVE SHEET

(71) Applicant: Tatsuta Electric Wire & Cable Co., Ltd., Higashiosaka (JP)

(72) Inventors: Yuusuke Haruna, Kizugawa (JP); Kenji Aoki, Kizugawa (JP); Hiroshi Tajima, Kizugawa (JP); Sougo Ishioka, Kizugawa (JP)

(73) Assignee: Tatsuta Electric Wire & Cable Co., Ltd., Osaka (JP)

( * ) Notice: Subject to any disclaimer, the term of this patent is extended or adjusted under 35 U.S.C. 154(b) by 211 days.

(21) Appl. No.: 18/417,803

(22) Filed: Jan. 19, 2024

(65) Prior Publication Data

US 2024/0158676 A1    May 16, 2024

Related U.S. Application Data

(63) Continuation of application No. 17/612,398, filed as application No. PCT/JP2020/019842 on May 20, 2020, now abandoned.

(30) Foreign Application Priority Data

May 20, 2019 (JP) ................................ 2019-094741

(51) Int. Cl.
*H05K 1/18* (2006.01)
*C09J 7/10* (2018.01)
(Continued)

(52) U.S. Cl.
CPC .................. *H05K 1/18* (2013.01); *C09J 7/10* (2018.01); *C09J 9/02* (2013.01); *C09J 11/04* (2013.01);
(Continued)

(58) Field of Classification Search
CPC .......... H05K 1/18; H05K 9/00; H05K 9/0081; C09J 9/02; C08K 2201/001
See application file for complete search history.

(56) References Cited

U.S. PATENT DOCUMENTS

| | | | |
|---|---|---|---|
| 10,899,949 B2 | 1/2021 | Tsukao et al. | |
| 2018/0002575 A1 | 1/2018 | Sato et al. | |
| 2019/0276709 A1 | 9/2019 | Tsukao et al. | |

FOREIGN PATENT DOCUMENTS

| | | |
|---|---|---|
| JP | 2003220669 A | 8/2003 |
| JP | 2018078096 A | 5/2018 |

(Continued)

OTHER PUBLICATIONS

Decision to Grant dated Oct. 21, 2021, issued in Japanese Application No. 2020-548839.
(Continued)

*Primary Examiner* — Nathan Milakovich
(74) *Attorney, Agent, or Firm* — RANKIN, HILL & CLARK LLP

(57) ABSTRACT

Provided is a conductive adhesive sheet that has excellent connection stability even containing conductive particles in a small proportion. The inventive conductive adhesive sheet contains a binder component and conductive particles. The conductive particles are distributively arranged. Assume that all the conductive particles are regularly arranged; and that an optional region of the conductive adhesive sheet is viewed in plan view so that a distribution number Np of the distributed conductive particles be 9 to 25, a condition: $1.5X \leq Y \leq 100X$ is met, where X represents the average of equivalent circle diameters of the distributed conductive particles; and Y represents the center-to-center distance between adjacent two of the distributed conductive particles, which are regularly arranged in the plan view. The ratio N/Np is 1.0 to 100.0, where N represents the number of the (Continued)

primary particles in the optional region. When optional three unique regions including the optional region are viewed in plan view so that the distribution number Np in each region be 9 to 25, the ratio Ng/Np is 0.8 to 1.0, where Ng represents the distribution number of conductive particles present in two or more of the three regions.

7 Claims, 3 Drawing Sheets

(51) Int. Cl.
    *C09J 9/02*         (2006.01)
    *C09J 11/04*       (2006.01)
    *C09J 11/08*       (2006.01)
    *H05K 9/00*        (2006.01)

(52) U.S. Cl.
    CPC ............ *C09J 11/08* (2013.01); *H05K 9/0081* (2013.01); *C09J 2203/326* (2013.01); *C09J 2301/314* (2020.08); *C09J 2301/408* (2020.08); *Y10T 428/28* (2015.01)

(56) References Cited

FOREIGN PATENT DOCUMENTS

| | | |
|---|---|---|
| JP | 2019029135 A | 2/2019 |
| WO | 2012164925 A1 | 12/2012 |
| WO | 2020235573 A1 | 11/2020 |

OTHER PUBLICATIONS

International Search Report dated Aug. 4, 2020, issued in International Application No. PCT/JP2020/019842.
Written Opinion dated Aug. 4, 2020, issued in International Application No. PCT/JP2020/019842.

CONDUCTIVE ADHESIVE SHEET

CROSS-REFERENCE TO RELATED APPLICATIONS

This application is a continuation of U.S. application Ser. No. 17/612,398 filed Nov. 18, 2021, the priority benefit of which is claimed and the contents of which are incorporated by reference. That application was the U.S. National Stage of International Application PCT/JP2020/019842 filed May 20, 2020, the priority benefit of which is claimed and the contents of which are incorporated by reference. That application, in turn, was based on and claimed the priority benefit of Japanese application 2019-094741 filed May 20, 2019, the priority benefit of which is claimed and the contents of which are incorporated by reference.

TECHNICAL FIELD

The present invention relates to conductive adhesive sheets.

BACKGROUND ART

Electroconductive adhesives (conductive adhesives) are heavily used in printed circuit boards. An example is a conductive adhesive sheet (conductive bonding film) typically for electrically connecting an electromagnetic shielding film disposed on a printed circuit board to an external ground for circuit grounding or to a stiffener (reinforcing member).

A known exemplary conductive adhesive sheet for use in printed circuit boards is a conductive sheet having a conductive layer including a thermosetting resin and dendritic conductive fine particles. In the conductive sheet, the conductive layer has a thickness that meets a specific condition. The dendritic conductive fine particles have an average particle diameter D50 of from 3 μm to 50 μm and are present in the conductive layer in a proportion of from 50 weight percent to 90 weight percent (see PTL 1).

CITATION LIST

Patent Literature

PTL 1: PCT International Publication Number WO2012/164925

SUMMARY OF INVENTION

Technical Problem

In economic terms, the amount of conductive particles to be used in such a conductive adhesive sheet is preferably minimized. However, with a decreasing amount of the conductive particles, the conductive adhesive sheet tends to have lower conductivity and lower connection stability.

The present invention has been made under these circumstances and has an object to provide a conductive adhesive sheet that has excellent connection stability even when containing conductive particles in a small proportion.

Solution to Problem

After intensive investigations to achieve the object, the inventors of the present invention have found that a specific conductive adhesive sheet has excellent connection stability even when containing conductive particles in a small proportion. In the conductive adhesive sheet, the relationship between the diameters of distributively arranged conductive particles and the distance or spacing between the distributively arranged conductive particles is controlled to be specific, and the arrangement of the conductive particles are regulated. The present invention has been made on the basis of these findings.

Specifically, the present invention provides, in an aspect, a conductive adhesive sheet containing a binder component and conductive particles. The conductive particles are distributively arranged each as a primary particle or an aggregate of primary particles. Assume that all the conductive particles are regularly arranged, and that an optional region of the conductive adhesive sheet is viewed in plan view so that a distribution number Np of the distributively arranged conductive particles be 9 to 25, the condition: $1.5X \leq Y \leq 100X$ is met, where X represents an average of equivalent circle diameters of the distributively arranged conductive particles; and Y represents a center-to-center distance between adjacent two of the distributively arranged conductive particles which are regularly arranged in the plan view. The ratio N/Np of the primary particles in the optional region to the distribution number Np is 1.0 to 100.0. When optional three unique regions including the optional region are viewed in plan view so that the distribution number Np in each region be 9 to 25, the ratio Ng/Np of the distribution number Ng of conductive particles present in two or more of the three regions to the distribution number Np is from 0.8 to 1.0.

In the conductive adhesive sheet according to the present invention, the conductive particles are distributively arranged as a primary particle or an aggregate of primary particles. As is described above, in a predetermined region (namely, in an optional region of the conductive adhesive sheet in such a plan view that a distribution number Np of the distributively arranged conductive particles be 9 to 25 with the assumption that all the conductive particles are regularly arranged), the center-to-center distance (Y) of adjacent distributively arranged conductive particles (aggregate units when the conductive particles are aggregates), which are regularly arranged in the plan view, and the average (X) of equivalent circle diameters of the distributively arranged conductive particles have a relationship that meets the condition: $1.5X \leq Y \leq 100X$. As the relationship meets the condition: $1.5X \leq Y$, the conductive particles disperse appropriately all around the conductive adhesive sheet, because adjacent conductive particles are sufficiently largely spaced. Thus, the conductive adhesive sheet exhibits good adhesion to an adherend. As the relation meets the condition: $Y \leq 100X$, the conductive adhesive sheet has excellent connection stability, because the spacing between the distributively arranged conductive particles is not too large.

The conductive adhesive sheet according to the present invention satisfies the following condition regarding the distributively arranged conductive particles (distributed conductive particles) in the predetermined region, as is described above. Specifically, the number (N) of primary particles of the distributed conductive particles and the number (Np) of the conductive particles with the assumption that all the conductive particles are regularly arranged have a relationship that meets the condition: $N/Np = 1.0$ to $100.0$. As the ratio N/Np is 1.0 or more, the conductive adhesive sheet has good connection stability while keeping the amount of the conductive particles small, because the conductive particles are arranged sufficiently at positions to be arranged, or the conductive particles are present in a sufficient number in a specific region or area. As the ratio N/Np is 100.0 or less, the conductive adhesive sheet has good adhesion to an adherend, because excessive aggregation of the conductive particles is restrained to some extent.

The conductive adhesive sheet according to the present invention also satisfies the following condition regarding the distributed conductive particles in the predetermined region, as is described above. When optional three unique regions including the optional region are viewed in plan view so that the distribution number Np in each region be 9 to 25, the ratio Ng/Np of the distribution number Ng of conductive particles present in two or more of the three regions to the distribution number Np is from 0.8 to 1.0. As the ratio Ng/Np is 0.8 or more, the conductive adhesive sheet has good connection stability and good adhesion to an adherend, because the conductive adhesive sheet has less proportions of missing arrangement of conductive particles in an ideal arrangement and of conductive particles that are arranged at positions out of the ideal arrangement.

The conductive adhesive sheet according to the present invention preferably has a ratio N/Np of 1.05 to 50.0. When the ratio N/Np is 1.05 or more, the conductive adhesive sheet has better connection stability, because the distributed conductive particles in the conductive adhesive sheet contain aggregates appropriately. When the ratio N/Np is 50.0 or less, the conductive adhesive sheet has better adhesion to an adherend, because the conductive particles are more restrained from excessive aggregation.

The conductive adhesive sheet according to the present invention preferably has a coefficient of variation of the center-to-center distance Y of 0.5 or less. The conductive adhesive sheet, when having such a configuration, has better adhesion to an adherend and better connection stability.

The conductive adhesive sheet according to the present invention preferably includes a thermosetting resin as the binder component. When having the configuration as above, the binder component can be cured after the conductive adhesive sheet according to the present invention is placed and receives pressurization and heating to fluidize the adhesive.

The conductive adhesive sheet according to the present invention preferably includes the conductive particles in a proportion of 10 to 60 mass percent of the totality (100 mass percent) of the conductive adhesive sheet. The conductive adhesive sheet according to the present invention, even when containing the conductive particles in such a small proportion as compared with conductive particles in conventional conductive bonding films, exhibits good connection stability when used as a conductive bonding film. The conductive adhesive sheet according to the present invention, when having such a configuration, is advantageously usable for conductive bonding film use.

The conductive adhesive sheet according to the present invention preferably has an area where a portion in which the conductive particles are distributively arranged has a large thickness as compared with a portion in which no conductive particle is distributively arranged. The conductive adhesive sheet according to the present invention, when having the configuration as above, has such a configuration that the area bearing or including the conductive particles protrudes as compared with the adhesive surface. The conductive adhesive sheet therefore has better connection stability with higher contact frequency of the conductive particles to an adherend.

The conductive adhesive sheet according to the present invention preferably has an average of the equivalent circle diameters of 15 to 100 μm. The conductive adhesive sheet according to the present invention, when having the configuration as above, has good connection stability as compared with conventional anisotropic conductive films. The conductive adhesive sheet according to the present invention, when having the configuration, is advantageously usable for conductive bonding film use.

The present invention provides, in another aspect, an electromagnetic shielding film including the conductive adhesive sheet.

The present invention provides, in still another aspect, a ground connector including the conductive adhesive sheet.

Advantageous Effects of Invention

The conductive adhesive sheet according to the present invention exhibits excellent connection stability even when containing conductive particles in a small proportion. The conductive adhesive sheet can therefore surely economically have connection stability as compared with conventional conductive bonding films.

DESCRIPTION OF EMBODIMENTS

Conductive Adhesive Sheet

The conductive adhesive sheet according to the present invention contains a binder component and conductive particles. The conductive particles are distributively arranged each as a primary particle or an aggregate (such as a secondary particle) derived from primary particles. The distributed conductive particles are approximately regularly arranged in rows or lines in a planar direction in plan view of the conductive adhesive sheet. Assume that all the conductive particles are regularly arranged; and that an optional or arbitrary region of the conductive adhesive sheet is viewed in plan view so that a distribution number Np of the distributed conductive particles be 9 to 25, the conductive adhesive sheet satisfies the condition: $1.5X \leq Y \leq 100X$, where X represents an average of equivalent circle diameters of the distributed conductive particles; and Y represents a center-to-center distance between adjacent two of the distributed conductive particles which are regularly arranged in the plan view. The ratio N/Np of the number of the primary particles in the optional region to the distribution number Np is 1.0 to 100.0. When optional three unique regions including the optional region are viewed in plan view so that the distribution number Np in each region be 9 to 25, the ratio Ng/Np of a distribution number of conductive particles present in two or more of the three regions to the distribution number Np is 0.8 to 1.0.

Figure 1:
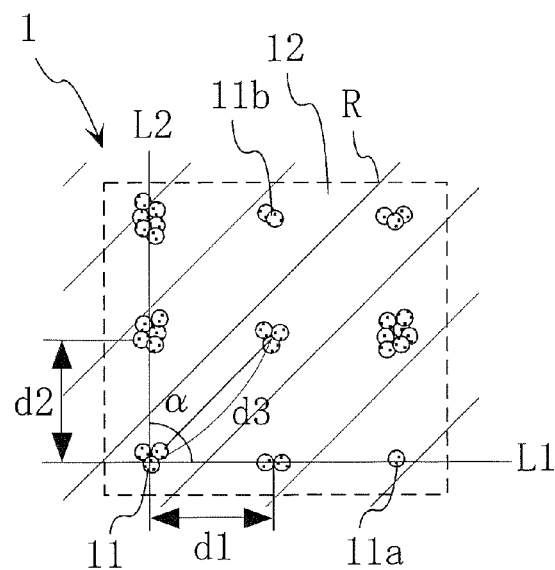
FIG. 1 is an enlarged top view of a conductive adhesive sheet according to an embodiment of the present invention.

An embodiment of the conductive adhesive sheet according to the present invention will be illustrated below. FIG. 1 is an enlarged top view of a conductive adhesive sheet according to an embodiment of the present invention.

As illustrated in FIG. 1, in the inventive conductive adhesive sheet 1, conductive particles 11 are distributively arranged in a binder component 12 in a region R in a planar direction of the conductive adhesive sheet 1. The conductive particles 11 are distributively arranged in units of primary particles when such a conductive particle is a primary particle 11a, and are distributively arranged in units of aggregates when such a conductive particle is an aggregate 11b. Hereinafter, the term "conductive particle", unless otherwise specified, refers to a distributively arranged conductive particle unit; specifically, refers to a primary particle when the conductive particle is distributively arranged as a primary particle; and refers to an aggregate when such conductive particles are distributively arranged in units of aggregates. In the region R, the distribution number of the distributed conductive particles is 9, with the assumption that all the conductive particles are regularly arranged. The distributed conductive particles 11 are regularly arranged in rows. Specifically, in other words, the conductive particles 11 are regularly arranged in a first arrangement direction L1, and in a second arrangement direction L2 that forms an angle α of 90° with the first arrangement direction L1. In the first arrangement direction L1, conductive particles 11 are arranged at approximately uniform spacing; and, two or more of such a row of the conductive particles are arranged in columns at approximately uniform spacing in the second arrangement direction L2 that forms an angle α of 90° with the first arrangement direction L1. The term "first arrangement direction L1" refers to a direction in which an adjacent conductive particle is arranged at the shortest distance from an optional conductive particle 11 (for example, distance d1 in FIG. 1). The term "second arrangement direction L2" refers to an arrangement direction different from the first arrangement direction L1, in which an adjacent conductive particle is arranged at the second shortest distance next to d1, or at a distance equal to D1, from the optional conductive particle 11 (for example, distance d2 in FIG. 1). Hereinafter, the term "third arrangement direction" refers to an arrangement direction different from the first arrangement direction L1 and the second arrangement direction L2, in which an adjacent conductive particle is arranged at the third shortest distance next to D2 or at a distance equal to D2 from the optional conductive particle 11 (for example, distance d3 in FIG. 1).

Figure 2:
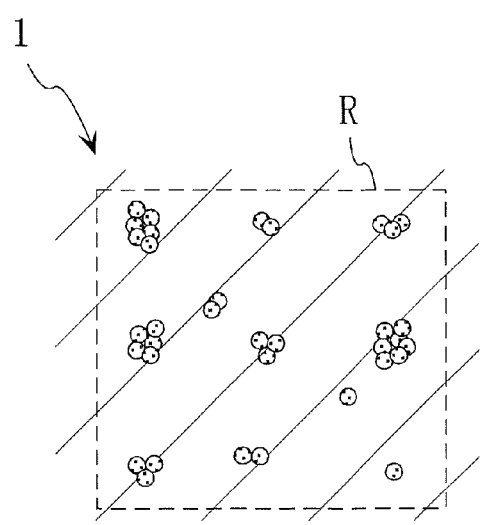
FIG. 2 is an enlarged top view of a conductive adhesive sheet according to another embodiment of the present invention.
Figure 3:
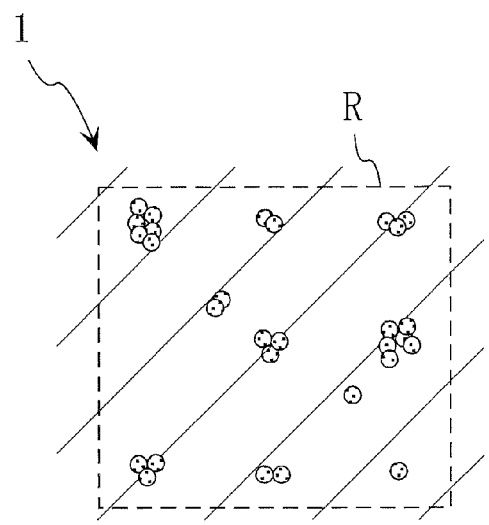
FIG. 3 is an enlarged top view of a conductive adhesive sheet according to still another embodiment of the present invention.

In FIG. 1, all the conductive particles 11 are regularly arranged in the region R. However, the conductive particles 11 in the present invention have only to be arranged approximately regularly. Examples of such approximately regular arrangements include an arrangement where some conductive particles 11 are slightly misaligned from the rows or columns, as illustrated in FIG. 2; and an arrangement where some conductive particles 11 are not arranged (are missing) at some positions in which the conductive particles are to be arranged, as illustrated in FIG. 3. Such misalignment and missing in arrangement may be within ranges not adversely affecting advantageous effects of the present invention.

Figure 4:
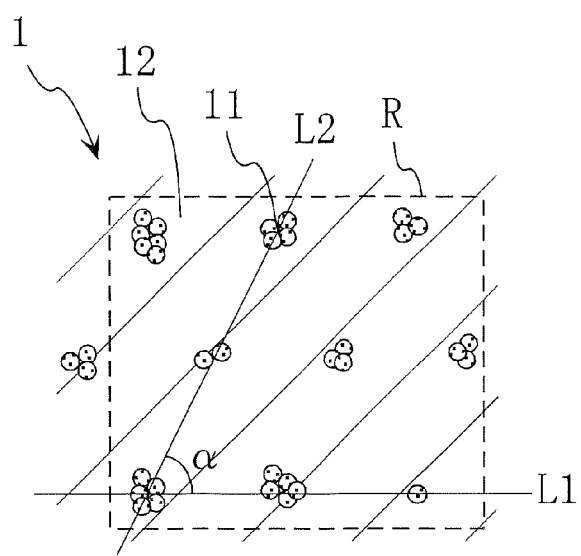
FIG. 4 is an enlarged top view of a conductive adhesive sheet according to another embodiment of the present invention.

The angle α which the first arrangement direction L1 forms with the second arrangement direction L2 is a smaller angle when two angles which the first arrangement direction L1 forms with the second arrangement direction L2 are different. The angle α is not limited and can be appropriately selected within the range of 0° to 90°. An exemplary arrangement where the angle α is an acute angle is an arrangement as illustrated in FIG. 4. Among them, the conductive adhesive sheet according to the present invention preferably has an arrangement where the angle α is 90°, as illustrated in FIGS. 1 to 3 (a lattice form), or an arrangement where the angle α is 45° (a hound's-tooth check form). When the conductive particles are arranged in a lattice form, the conductive adhesive sheet may have better adhesion to an adherend and better connection stability.

In the conductive adhesive sheet according to the present invention, the center-to-center distance Y (d1, d2, or d3 in FIG. 1) of distributed conductive particles that are adjacent in a planar direction, and the average X of equivalent circle diameters of the distributed conductive particles have a relationship that meets the condition: $1.5X \leq Y \leq 100X$. As the condition: $1.5X \leq Y$ is met, the conductive adhesive sheet has good adhesion to an adherend. This is because conductive particles adjacent in the planar direction are sufficiently largely spaced, and the conductive particles appropriately disperse all around the conductive adhesive sheet. As the condition: $Y \leq 100X$ is met, the conductive adhesive sheet has excellent connection stability, because the conductive particles are distributively arranged at spacing that is not too large. The lower limit of the center-to-center distance Y is preferably 3X, more preferably 5X, and still more preferably 7X. The upper limit of the center-to-center distance Y is preferably 50X, more preferably 30X, and still more preferably 15X. In the conductive adhesive sheet according to the present invention, the center-to-center distance d1, the center-to-center distance d2, and center-to-center distance d3 each meet the condition: $1.5X \leq Y \leq 100X$.

The term "equivalent circle diameter" of a conductive particle refers to the equivalent circle diameter of a primary particle when the distributively arranged conductive particle is the primary particle; and refers to the equivalent circle diameter of an aggregate, such as a secondary particle, when the distributively arranged conductive particle is the aggregate. The equivalent circle diameter is calculated typically by image analysis of an optical photomicrograph in an optional region in which the distribution number Np is 9 to 25 (for example, 9 in the region R in FIG. 1) with the assumption that all the conductive particles are regularly arranged (in a perfect arrangement). Specifically, the equivalent circle diameter can be calculated after taking the image of an optical photomicrograph into a personal computer (PC), where the photomicrograph has been taken at such a magnification that a 1-mm square region falls within the photomicrograph, and subjecting the image to image processing. The distribution number Np in the optional region is preferably 9, 16, or 25 in which the conductive particles are distributively arranged in an equal number both in the first arrangement direction L1 and the second arrangement direction L2.

The average X of equivalent circle diameters of the conductive particles is preferably 2 to 120 μm, more preferably 15 to 100 μm, and still more preferably 25 to 80 μm, although the conductive adhesive sheet may have any other average X. The conductive adhesive sheet according to the present invention, when having an average X of the equivalent circle diameters within the range, exhibits good connection stability as compared with conventional anisotropic conductive films. When having the configuration as above, the conductive adhesive sheet according to the present invention is advantageously usable for conductive bonding film use.

The center-to-center distance Y is determined typically as a center-to-center distance (distance between the conductive particles) Y of two conductive particles that are regularly arranged in the region R for determination of the center-to-center distance Y and are adjacent to each other in the same arrangement direction. When the distributed conductive particle in question is an aggregate, the "center" refers to the center of the equivalent circle of the aggregate.

The coefficient of variation of the center-to-center distances Ys is preferably 0.5 or less, and more preferably 0.3 or less, although the coefficient of variation is not limited. The coefficient of variation of the center-to-center distances Ys works as a measure or scale for degree of regular arrangement of the distributed conductive particles. The coefficient of variation of the center-to-center distances Ys of conductive particles is a value determined by dividing the standard deviation of the center-to-center distances of the conductive particles by the average of the center-to-center distances. When the coefficient of variation is 0.5 or less, the conductive adhesive sheet has connection stability and adhesion to an adherend in better balance, because the distributed conductive particles are arranged highly regularly.

The center-to-center distance d1 from a conductive particle adjacent in the first arrangement direction L1, the center-to-center distance d2 from a conductive particle adjacent in the second arrangement direction L2, and the center-to-center distance d3 from a conductive particle adjacent in the third arrangement direction may be different from one another, or two or more of them may be identical, or all of them may be identical.

The center-to-center distances d1, d2, and d3 are each preferably 100 to 1000 µm, more preferably 150 to 800 µm, and still more preferably 200 to 600 µm. The conductive adhesive sheet, when having center-to-center distances within the range, has adhesion to an adherend and connection stability both at better levels.

In the conductive adhesive sheet according to the present invention, the number (N) of primary particles of the conductive particles and the number (Np) of conductive particles with the assumption that all the conductive particles are regularly arranged (in a perfect arrangement) have a relationship meeting the condition: N/Np=1.0 to 100.0. As the ratio N/Np is 1.0 or more, the conductive adhesive sheet has good connection stability, because conductive particles are arranged sufficiently at positions to be arranged, or conductive particles are present in a sufficient number in a specific region (area). As the ratio N/Np is 100.0 or less, the conductive adhesive sheet exhibits good adhesion to an adherend with a smaller amount of conductive particles to be used, because excessive aggregation of the conductive particles is restrained to some extent. The ratio N/Np is determined in the optional region defined for the determination of the center-to-center distance Y.

The ratio N/Np is preferably 1.05 to 50.0, more preferably 1.2 to 30.0, and still more preferably 1.5 to 10.0. When the ratio N/Np is 1.05 or more, the conductive adhesive sheet has better connection stability, because the distributed conductive particles in the conductive adhesive sheet include aggregates appropriately. When the ratio N/Np is 50.0 or less, the conductive adhesive sheet has better adhesion to an adherend, because excessive aggregation of conductive particles is more restrained.

For example, in the conductive adhesive sheets 1 illustrated in FIGS. 1 to 3, the distribution numbers Np in the region R are each 9. The number N in FIG. 1 is 32 (N/Np=3.6), the number N in FIG. 2 is 35 (N/Np=3.9), and the number N in FIG. 3 is 39 (N/Np=4.3).

In the conductive adhesive sheet according to the present invention, when optional three unique regions including the optional region are viewed in plan view so that the distribution number Np in each region be 9 to 25, the ratio Ng/Np of the distribution number Ng of conductive particles present in two or more of the three regions to the distribution number Np is 0.8 to 1.0, preferably 0.85 to 1.0, and more preferably 0.9 to 1.0. As the ratio Ng/Np is 0.8 or more, the conductive adhesive sheet has good connection stability and good adhesion to an adherend, because the conductive adhesive sheet has less proportions of missing arrangement of conductive particles in ideal arrangement and of conductive particles that are arranged at positions out of the ideal arrangement. The conductive adhesive sheet desirably has a higher ratio Ng/Np, and the ratio Ng/Np is most preferably 1.0. Of the three regions defined for the determination of the ratio Ng/Np, one region is the optional region defined for the determination of the center-to-center distance Y, and the other two regions are regions that do not include the conductive particles present in the optional region, and do not include any of conductive particles that overlap each other. The three regions to be selected are regions having an identical Np.

Specifically, typically on the assumption that FIGS. 1 to 3 are enlarged views of different regions in one conductive adhesive sheet according to the present invention, the three regions defined for the determination of the ratio Ng/Np in the conductive adhesive sheet according to the present invention are the region R in FIG. 1, the region R in FIG. 2, and the region R in FIG. 3. However, there is no conductive particle that overlaps in each of the three regions Rs in FIGS. 1 to 3. When FIGS. 1 to 3 are superimposed, the distribution number of conductive particles that are present in two or more regions is 9, because, of Np=9 in the three regions, the distribution number where no conductive particle is present is 0; the distribution number of conductive particles that are present only in one region is 0; the distribution number of conductive particles that are present in two regions is 1; and the distribution number of conductive particles that are present in three regions is 8. In this case, the ratio Ng/Np is 1.0.

Figure 5:
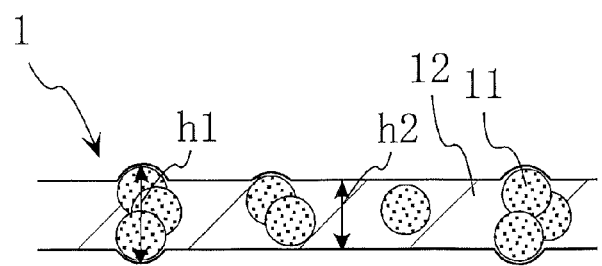
FIG. 5 is a schematic cross-sectional view of a conductive adhesive sheet according to an embodiment of the present invention.

Preferably, in an area or areas of the conductive adhesive sheet according to the present invention, a portion where the conductive particles are arranged has a thickness (for example, h1 given in FIG. 5) larger than the thickness (for example, h2 in FIG. 5) of a portion where no conductive particle is arranged. The conductive adhesive sheet according to the present invention, when having the configuration as above, has such a configuration that a portion where conductive particles are arranged protrudes from the adhesion face. Thus, the conductive adhesive sheet has high contact frequency of the conductive particles to an adherend and has still better connection stability. FIG. 5 is a schematic cross-sectional view of a conductive adhesive sheet according to an embodiment of the present invention.

The conductive adhesive sheet according to the present invention has a thickness appropriately selectable according to the intended use, and has a thickness of typically 1 to 50 µm, and preferably 5 to 25 µm. The conductive adhesive sheet, when having a thickness of 1 µm or more, can be more satisfactorily embedded in an opening disposed in an electromagnetic shielding assembly of a printed circuit board. The conductive adhesive sheet, when having a thickness of 50 µm or less, can meet demands for thinning. The conductive adhesive sheet according to the present invention, when to be suitably used as a bonding film, may have a thickness of typically 10 to 70 µm, and preferably 30 to 65 µm.

The conductive adhesive sheet according to the present invention has a number of conductive particles (primary particles) per unit area of preferably 10 to 1000 per square millimeter, more preferably 20 to 800 per square millimeter, and still more preferably 30 to 600 per square millimeter, although the conductive adhesive sheet may have any other number per unit area. The conductive adhesive sheet, when having a number per unit area within the range, has connection stability and adhesion to an adherend in better balance.

The conductive adhesive sheet according to the present invention has an electric resistance of preferably 1Ω or less, and more preferably 0.5Ω or less, as measured after heating and pressurization at 170° C. and 3.0 MPa.

Non-limiting examples of the binder component include thermoplastic resins, thermosetting resins, and actinic radiation-curable compounds. The conductive adhesive sheet may include each of different binder components alone or in combination.

Non-limiting examples of the thermoplastic resins include polystyrene resins, vinyl acetate resins, polyester resins, polyolefin resins (such as polyethylene resins and polypropylene resin compositions), polyimide resins, and acrylic resins. The binder component may include each of different thermoplastic resins alone or in combination.

Examples of the thermosetting resins include both resins having thermosetting property (thermosetting resins) and resins resulting from curing of the thermosetting resins. Non-limiting examples of the thermosetting resins include phenolic resins, epoxy resins, urethane resins, melamine resins, and alkyd resins. The binder component may include each of different thermosetting resins alone or in combination.

Non-limiting examples of the epoxy resins include bisphenol epoxy resins, spirocyclic epoxy resins, naphthalene epoxy resins, biphenyl epoxy resins, terpene epoxy resins, glycidyl ether epoxy resins, glycidylamine epoxy resins, and novolac epoxy resins.

Non-limiting examples of the bisphenol epoxy resins include bisphenol-A epoxy resins, bisphenol-F epoxy resins, bisphenol-S epoxy resins, and tetrabromobisphenol-A epoxy resins. Non-limiting examples of the glycidyl ether epoxy resins include tris(glycidyloxyphenyl)methane and tetrakis(glycidyloxyphenyl)ethane. A non-limiting example of the glycidylamine epoxy resins is tetraglycidyldiaminodiphenylmethane. Non-limiting examples of the novolac epoxy resins include epoxy cresol novolac resins, epoxy phenol novolac resins, α-naphthol novolac epoxy resins, and brominated epoxy phenol novolac resins.

Examples of the actinic radiation-curable compounds include both actinic radiation-curable compounds, which are compounds curable by actinic radiation irradiation; and compounds resulting from curing of the actinic radiation-curable compounds. Non-limiting examples of the actinic radiation-curable compounds include polymerizable compounds having at least two radically reactive groups (such as (meth)acryloyl groups) in the molecule. The binder component may include each of different actinic radiation-curable compounds alone or in combination.

Among them, the binder component preferably includes a thermosetting resin. In this case, the binder component can be cured after the conductive adhesive sheet according to the present invention is placed and receives pressurization and heating to fluidize the adhesive.

The binder component, when including a thermosetting resin, may include a curing agent for promoting heat cure reaction, as a component constituting the binder component. The curing agent can be appropriately selected according to the type of the thermosetting resin. The binder component may include each of different curing agents alone or in combination.

The conductive adhesive sheet according to the present invention includes the binder component in a proportion of preferably 40 to 90 mass percent, more preferably 45 to 85 mass percent, and still more preferably 50 to 80 mass percent, of the totality (100 mass percent) of the conductive adhesive sheet. The conductive adhesive sheet, when containing the binder component in a proportion of 40 mass percent or more, exhibits better adhesion to an adherend and better fluidity upon pressurization-heating. The conductive adhesive sheet, when containing the binder component in a proportion of 90 mass percent or less, can include the conductive particles in a sufficient amount.

Non-limiting examples of the conductive particles include metal particles, metal-coated resin particles, and carbon fillers. The conductive adhesive sheet may include each of different types of conductive particles alone or in combination.

Non-limiting examples of metals constituting the metal particles and constituting the coating layer of the metal-coated resin particles include gold, silver, copper, nickel, zinc, tin, bismuth, and indium. The conductive particles may include or bear each of different metals alone or in combination.

Specifically, non-limiting examples of the metal particles include copper particles, silver particles, nickel particles, silver-coated copper particles, gold-coated copper particles, silver-coated nickel particles, gold-coated nickel particles, silver-coated alloy particles, tin-coated copper particles, tin-coated nickel particles, and solder particles. Non-limiting examples of the silver-coated alloy particles include silver-coated copper alloy particles including copper-containing alloy particles (such as copper alloy particles made of an alloy among copper, nickel, and zinc) coated with silver. The metal particles can be prepared typically by electrolytic process, atomization, or reducing process.

Among them, the metal particles preferably include any of silver particles, silver-coated copper particles, silver-coated copper alloy particles, tin-coated copper particles, tin-coated nickel particles, and solder particles. Of these, silver particles, silver-coated copper particles, and silver-coated copper alloy particles are preferred, and silver-coated copper particles and silver-coated copper alloy particles are particularly preferred, from the viewpoints of excellent conductivity, restrainment of oxidation and aggregation of metal particles, and lower cost of the metal particles. Tin-coated copper particles, tin-coated nickel particles, and solder particles are also preferred, from the viewpoint of forming an alloy with the circuit or grounding member of the printed circuit board and establishing firm connection thereto.

Non-limiting examples of the shape or form of the conductive particles include spherical, flaky (scaly), dendritic, fibrous, and amorphous (polyhedral) forms. Among them, the conductive particles preferably have a spherical, dendritic, or amorphous (polyhedral) form, for providing lower electric resistance of the conductive adhesive sheet.

The conductive particles have a median diameter (D50) of preferably 15 to 100 µm, and more preferably 25 to 80 µm, although the conductive particles may have any other median diameter (D50). The conductive adhesive sheet according to the present invention, when having a median diameter D50 of the conductive particles within the range, exhibits satisfactory connection stability as compared with conventional anisotropic conductive films. The conductive adhesive sheet according to the present invention, when having the configuration as above, is advantageously usable for conductive bonding film use. The term "median diameter D50" refers to a particle size at an integrated value of 50% in a particle size distribution determined by laser diffraction scattering technique.

The conductive adhesive sheet according to the present invention contains the conductive particles in a proportion of preferably 10 to 60 mass percent, more preferably 15 to 55 mass percent, and still more preferably 20 to 50 mass percent, of the totality (100 mass percent) of the conductive adhesive sheet, although the proportion is not limited. The conductive adhesive sheet, when containing the conductive particles in a proportion of 10 mass percent or more, may exhibit better connection stability. The conductive adhesive sheet, when containing the conductive particles in a proportion of 60 mass percent or less, may have better adhesion to an adherend. The conductive adhesive sheet according to the present invention, when used as a conductive bonding film, exhibits good connection stability even when containing the conductive particles in such a small proportion as above, as compared with the proportion of conductive particles in conventional conductive bonding films. The conductive adhesive sheet according to the present invention, when having the configuration as above, is advantageously usable for conductive bonding film use.

The conductive adhesive sheet according to the present invention may further include one or more components other than the above-mentioned components, within ranges not adversely affecting the advantageous effects of the present invention. Examples of the other components include components contained in known or common conductive adhesive sheets. Non-limiting examples of the other components include flame retardants, plasticizers, antifoaming agents, viscosity modifiers, antioxidants, diluents, antisettling agents, fillers, colorants, leveling agents, coupling agents, and tackifier resins. The conductive adhesive sheet may include each of different other components alone or in combination.

The conductive adhesive sheet according to the present invention can be produced by a known or common production method. For example, the conductive adhesive sheet may be produced by applying an adhesive composition for the formation of a conductive adhesive sheet onto a temporary substrate such as a separate film, or onto a substrate, and as needed, subjecting the coated layer to desolvation and/or partial curing. To arrange conductive particles in an arrangement specified in the present invention, the conductive adhesive sheet may be produced by applying an adhesive composition containing no conductive particle, and then embedding the conductive particles at desired positions in the adhesive composition. Alternatively, the conductive adhesive sheet may be produced by arraying the conductive particles on a temporary substrate or a substrate in an arrangement specified in the present invention, thereafter applying an adhesive composition containing no conductive particle, and then, as needed, subjecting the applied composition to desolvation and/or partial curing.

The adhesive composition may further include, for example, a solvent (solventing medium), in addition to the components to be contained in the conductive adhesive sheet. Non-limiting examples of the solvent include toluene, acetone, methyl ethyl ketone, methanol, ethanol, propanol, and dimethylformamide. The solids concentration of the adhesive composition is appropriately set according typically to the thickness of the conductive adhesive sheet to be formed.

The adhesive composition may be applied by a known coating technique. For example, the adhesive composition may be applied using a coater such as a rotogravure roll coater, reverse roll coater, kiss-contact roll coater, lip coater, dip roll coater, bar coater, knife coater, spray coater, comma coater, direct coater, or slot die coater.

The conductive adhesive sheet according to the present invention is preferably used for printed circuit board use, and particularly preferably used for conductive bonding film use, from the viewpoints of adhesion to an adherend and connection stability. Non-limiting examples of the printed circuit board use include a conductive bonding film, as well as a conductive adhesive sheet constituting an electromagnetic shielding assembly (for example, a conductive adhesive sheet disposed on an insulating protective layer which covers a circuit pattern of a printed circuit board). Non-limiting examples of the conductive bonding film include adhesives for FGFs, bonding films for bonding between a stiffener and a printed circuit board, and bonding films for bonding between an external ground for circuit grounding and a printed circuit board.

Figure 6:
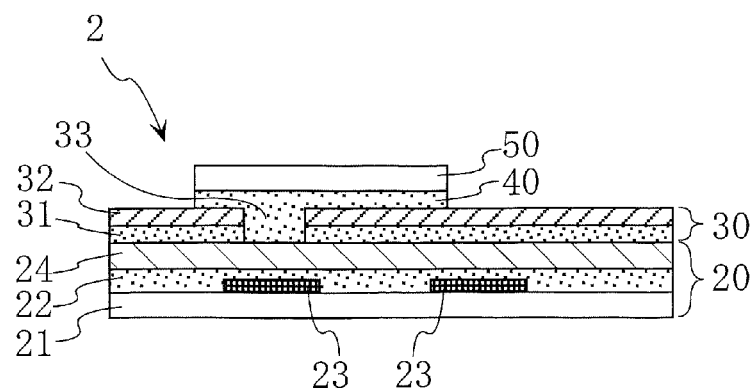
FIG. 6 is a schematic cross-sectional view of an exemplary printed circuit board formed using a conductive adhesive sheet according to an embodiment of the present invention.

FIG. 6 illustrates a conductive adhesive sheet according to an exemplary embodiment of the present invention when used as a conductive bonding film between a stiffener and a printed circuit board. A shielded printed circuit board 2 in FIG. 6 includes a printed circuit board 20; an electromagnetic shielding assembly 30 disposed on the printed circuit board 20; a conductive adhesive layer 40 charged in a through hole 33 provided in the electromagnetic shielding assembly 30; and a stiffener 50 bonded through the conductive adhesive layer 40. The conductive adhesive layer 40 is made of or from the conductive adhesive sheet according to the present invention.

The printed circuit board 20 includes a base 21; a circuit pattern 23 disposed partially on the base 21; an insulating protective layer (cover lay) 24 that covers and insulatively protects the circuit pattern 23; and an adhesive layer 22 that covers the circuit pattern 23 and bonds the circuit pattern 23 and the base 21 to the insulating protective layer 24. The circuit pattern 23 includes signal circuits.

The electromagnetic shielding assembly 30 includes a conductive adhesive layer 31 and an insulating layer 32 disposed in this sequence on the printed circuit board 20, more specifically, on the insulating protective layer 24 of the printed circuit board 20. The conductive adhesive layer 31 and the insulating layer 32 have a through hole 33 that penetrates these layers in a thickness direction (namely, the surface of the printed circuit board 20 is exposed). The presence of the through hole 33 allows the conductive adhesive sheet according to the present invention to flow into the through hole 33 by pressurization and heating to form the conductive adhesive layer 40 and to be electrically connected to the conductive adhesive layer 31. The printed circuit board 20, more specifically, the insulating protective layer 24 defines the bottom of the through hole 33. Specifically, the through hole 33 is defined by the side of the insulating layer 32, the side of the conductive adhesive layer 31, and the surface of the printed circuit board 20 (in particular, of the insulating protective layer 24). The conductive adhesive layer 31 may be the conductive adhesive sheet according to the present invention, or a layer formed from the conductive adhesive sheet according to the present invention (for example, one formed by thermocompression bonding).

The electromagnetic shielding assembly 30 can be prepared using an electromagnetic shielding film. The electromagnetic shielding film may be a shielding film including the conductive adhesive sheet according to the present invention (electromagnetic shielding film according to the present invention). The electromagnetic shielding film typically includes a transfer film, an insulating layer (protective layer), the conductive adhesive sheet according to the present invention (conductive bonding layer), and a separate film disposed in the specified sequence. Upon use, the separate film is removed to expose the surface of the electromagnetic shielding film, the exposed surface is applied to the printed circuit board 20, and then the transfer film is removed.

Functionally, the conductive adhesive layer 40 is disposed on the electromagnetic shielding assembly 30, fills the through hole 33 with itself, and is electrically connected through the through hole 33 to the conductive adhesive layer 31. The stiffener 50 is secured through the conductive adhesive layer 31 to the printed circuit board 20 and the electromagnetic shielding assembly 30.

When the stiffener 50 works as a grounding component, the conductive adhesive layer 40 functions as a ground connector. As the ground connector, the conductive adhesive sheet according to the present invention can be used. The ground connector is a ground connector having the conductive adhesive sheet according to the present invention (ground connector according to the present invention). The ground connector may include a conductor such as a metal layer disposed on the conductive adhesive sheet according to the present invention.

The conductive adhesive layer 40 is not in contact with (does not reach) the circuit pattern. This configuration can eliminate or minimize insufficient charging of the adhesive to form the conductive adhesive layer 40 into the through hole, and resulting entry of air bubbles into the through hole, because the adhesive has only to flow into the through hole in a small dimension. This can restrain interfacial delamination typically in reflow process and give stable connection reliability.

The presence of the stiffener 50 in the shielded printed circuit board 2 allows the printed circuit board 20 to retain its shape. When the shielded printed circuit board is bent, such a stiffener having a certain area laminated on the top of the electromagnetic shielding assembly can restrain the resilience of the resulting multilayer assembly and maintains the shape as being bent. The shielded printed circuit board is therefore preferably a flexible printed circuit board (FPC).

The shielded printed circuit board can be produced by a production method typically including a stiffener stacking step and a thermocompression bonding step. The stiffener stacking step is the step of stacking a stiffener including an electromagnetic bonding film, which is the conductive adhesive sheet according to the present invention, on the top of the through hole, so as to bring the electromagnetic bonding film into contact with the electromagnetic shielding assembly. The thermocompression bonding step is the step of conducting thermocompression bonding to allow the electromagnetic bonding film to flow into the through hole to form a conductive adhesive layer and to allow the conductive adhesive layer derived from the electromagnetic bonding film to come into contact with the conductive adhesive layer of the electromagnetic shielding assembly.

Specifically, in the stiffener stacking step, the conductive bonding film, which is the conductive adhesive sheet according to the present invention, and the stiffener 50 are laminated on each other, the laminate is cut to an optional size, and is arranged on the insulating layer 32 so that the surface of the conductive bonding film closes or plugs the opening of the through hole 33. In the thermocompression bonding step, the conductive bonding film softens and is fluidized by pressurization and heating, and flows into and fills the through hole 33 by the action of the pressure upon pressurization. The charged conductive bonding film is then cured by subsequent cooling or thermal polymerization and forms the conductive adhesive layer 40. Thus, the conductive bonding film fluidizes by thermocompression bonding and comes into contact with the conductive adhesive layer 31.

REFERENCE SIGNS LIST 1 conductive adhesive sheet according to the present invention
11 conductive particle
11a conductive particle (primary particle)
11b conductive particle (aggregate)
12 binder component
R region
L1 first arrangement direction
L2 second arrangement direction
α angle formed by the first arrangement direction L1 and the first arrangement direction L2
d1 center-to-center distance between adjacent conductive particles in the first arrangement direction
d2 center-to-center distance between adjacent conductive particles in the second arrangement direction
d3 center-to-center distance between adjacent conductive particles in the third arrangement direction
h1 thickness of a portion where a conductive particle is arranged
h2 thickness of a portion where no conductive particle is arranged
2 shielded printed circuit board
20 printed circuit board
21 base
22 adhesive layer
23 circuit pattern (trace)
24 insulating protective layer (cover lay)
30 electromagnetic shielding assembly
31 conductive adhesive layer
32 insulating layer
33 through hole
40 conductive adhesive layer
50 stiffener

The invention claimed is:

1. A shielded printed circuit board with a stiffener, wherein the stiffener is bonded through a conductive adhesive sheet to the shielded printed circuit board, wherein the shielded printed circuit board includes a printed circuit board and an electromagnetic shielding assembly disposed on the printed circuit board,
wherein the printed circuit board includes a base, a circuit pattern disposed on the base, an insulating protective layer that covers the circuit pattern, and an adhesive layer that covers the circuit pattern and bonds the circuit pattern and the base to the insulating protective layer,
wherein the electromagnetic shielding assembly includes a conductive adhesive layer, an insulating layer, and a through hole that penetrates the conductive adhesive layer and the insulating layer in a thickness direction, wherein the electromagnetic shielding assembly is disposed on the printed circuit board so that the conductive adhesive layer is directly disposed on the insulating protective layer of the printed circuit board, wherein the stiffener is laminated over the through hole so that the conductive adhesive sheet is in contact with the electromagnetic shielding assembly, and wherein the conductive adhesive sheet comprises:
a binder component; and
conductive particles, wherein the conductive particles are distributively arranged throughout the conductive adhesive sheet, with at least some of the conductive particles being present as aggregates of individual, primary particles and with at least some of the aggregates of individual, primary particles in a given arbitrary region having different numbers of primary particles as compared to each other, wherein, with the assumption that all the conductive particles are regularly arranged; and that the given arbitrary region of the conductive adhesive sheet is viewed in plan view so that a distribution number Np of the distributively arranged conductive particles is 9 to 25, a condition: $1.5X \leq Y \leq 100X$ is met, where X represents an average of equivalent circle diameters of the distributively arranged conductive particles; and Y represents a center-to-center distance between adjacent two of the distributively arranged conductive particles which are regularly arranged in the plan view, wherein a ratio N/Np is 1.05 to 50.0, where N represents a number of the primary particles in the given arbitrary region, wherein, when three unique arbitrary regions including the given arbitrary region are viewed in plan view so that the distribution number Np in each region is 9 to 25, a ratio Ng/Np is 0.8 to 1.0, where Ng represents a distribution number of conductive particles present in two or more of the three regions, wherein the center-center-distance Y is 100 to 1000 μm, wherein the conductive particles have a particle size of 25 to 80 μm, and wherein the conductive adhesive sheet is 10 to 70 μm in film thickness.

2. The shielded printed circuit board with a stiffener according to claim 1, wherein the center-to-center distance Y has a coefficient of variation of 0.5 or less.

3. The shielded printed circuit board with a stiffener according to claim 1, wherein the conductive adhesive sheet comprises a thermosetting resin as the binder component.

4. The shielded printed circuit board with a stiffener according to claim 1, wherein the conductive adhesive sheet contains the conductive particles in a proportion of 10 to 60 mass percent of the totality, 100 mass percent, of the conductive adhesive sheet.

5. The shielded printed circuit board with a stiffener according to claim 1, wherein, at least in an area of the conductive adhesive sheet, a portion in which the conductive particles are distributively arranged has a large thickness as compared with a portion in which no conductive particle is distributively arranged.

6. The shielded printed circuit board with a stiffener according to claim 1, wherein the average X of the equivalent circle diameters is 2 to 120 μm.

7. The shielded printed circuit board with a stiffener according to claim 1, wherein the conductive adhesive layer comprises a conductive adhesive sheet in accordance with claim 1.

* * * * *